(12) United States Patent
Minamisawa et al.

(10) Patent No.: US 9,887,086 B2
(45) Date of Patent: Feb. 6, 2018

(54) METHOD FOR MANUFACTURING A WIDE BANDGAP JUNCTION BARRIER SCHOTTKY DIODE

(71) Applicant: ABB Schweiz AG, Baden (CH)

(72) Inventors: Renato Minamisawa, Windisch (CH); Munaf Rahimo, Uezwil (CH)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 15/616,382

(22) Filed: Jun. 7, 2017

(65) Prior Publication Data

US 2017/0271158 A1 Sep. 21, 2017

Related U.S. Application Data

(63) Continuation of application No. PCT/EP2015/075730, filed on Nov. 4, 2015.

(30) Foreign Application Priority Data

Dec. 8, 2014 (EP) .................................. 14196737

(51) Int. Cl.
*H01L 21/20* (2006.01)
*H01L 29/16* (2006.01)
(Continued)

(52) U.S. Cl.
CPC ...... *H01L 21/0485* (2013.01); *H01L 21/0495* (2013.01); *H01L 29/0619* (2013.01); *H01L 29/1608* (2013.01); *H01L 29/872* (2013.01)

(58) Field of Classification Search
CPC ............. H01L 21/0485; H01L 21/0495; H01L 29/0619; H01L 29/1608
See application file for complete search history.

(56) References Cited

U.S. PATENT DOCUMENTS 7,105,875 B2 * 9/2006 Singh .................. H01L 27/0814
257/220
8,450,196 B2 5/2013 Rupp et al.
(Continued)

FOREIGN PATENT DOCUMENTS

EP 1885000 A2 2/2008
JP 2010080797 A 4/2010
(Continued)

OTHER PUBLICATIONS

European Patent Office, International Search Report & Written Opinion issued in corresponding Application No. PCT/EP2015/075730, dated Feb. 29, 2016, 10 pp.
(Continued)

*Primary Examiner* — Seahvosh Nikmanesh
(74) *Attorney, Agent, or Firm* — Taft Stettinius & Hollister LLP

(57) ABSTRACT

A method for manufacturing a wide bandgap junction barrier Schottky diode having an anode side and a cathode side is provided, wherein an (n+) doped cathode layer is arranged on the cathode side, at least on p doped anode layer is arranged on the anode side, an (n−) doped drift layer is arranged between the cathode layer and the at least one anode layer, which drift layer extends to the anode side, wherein the following manufacturing steps are performed: a) providing an (n+) doped wide bandgap substrate, b) creating the drift layer on the cathode layer, c) creating the at least one anode layer on the drift layer, d) applying a first metal layer on the anode side on top of the drift layer for forming a Schottky contact, characterized in, that e) creating a second metal layer on top of at least one anode layer, wherein after having created the first and the second metal layer, a metal layer on top of the at least one anode layer has a second thickness and a metal layer on top of the drift layer has a first thickness, wherein the second thickness is smaller (Continued)

than the first thickness, f) then performing a first heating step at a first temperature, by which due the second thickness being smaller than the first thickness an ohmic contact is formed at the interface between the second metal layer and the at least one anode layer, wherein performing the first heating step such that a temperature below the first metal layer is kept below a temperature for forming an ohmic contact.

20 Claims, 7 Drawing Sheets

(51) Int. Cl.
  *H01L 21/04* (2006.01)
  *H01L 29/872* (2006.01)
  *H01L 29/06* (2006.01)

(56) References Cited

U.S. PATENT DOCUMENTS

2002/0125482 A1 9/2002 Friedrichs et al.
2012/0256195 A1* 10/2012 Aketa ............... H01L 29/1608
  257/77
2014/0197422 A1 7/2014 Wada et al.
2015/0048489 A1* 2/2015 Van Brunt ........... H01L 29/861
  257/655

FOREIGN PATENT DOCUMENTS

JP  2011165880 A  8/2011
JP  2012044006 A  3/2012

OTHER PUBLICATIONS

European Patent Office, International Preliminary Report on Patentability issued in corresponding Application No. PCT/EP2015/075730, dated Nov. 28, 2016, 13 pp.

European Patent Office, Extended Search Report issued in corresponding Application No. 14196737.2, dated Sep. 2, 2015, 6 pp.

* cited by examiner

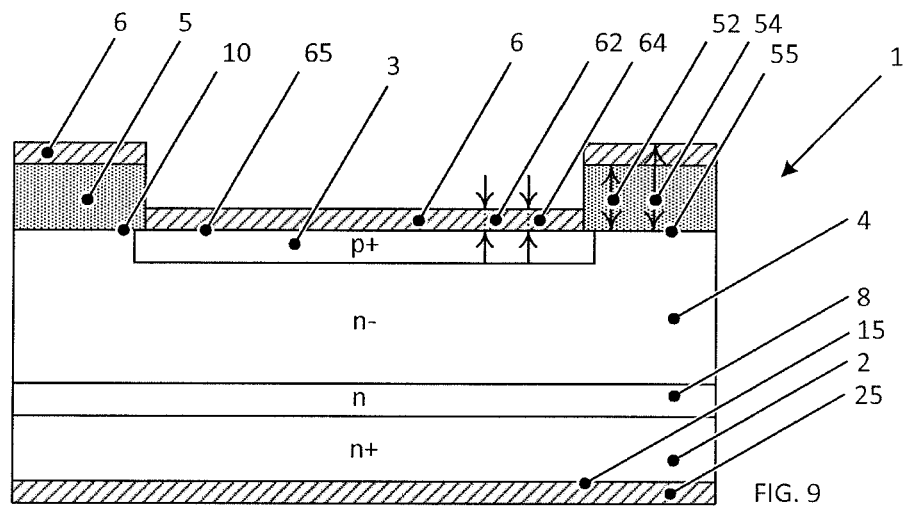
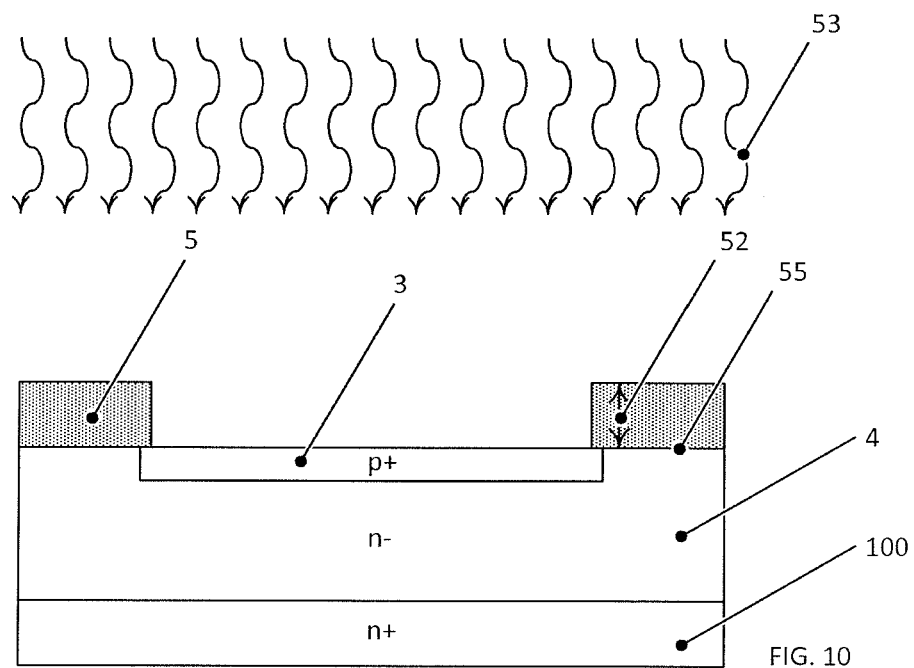

METHOD FOR MANUFACTURING A WIDE BANDGAP JUNCTION BARRIER SCHOTTKY DIODE

TECHNICAL FIELD

The invention relates to the field of power electronics and more particularly to a method for manufacturing a Junction Barrier Schottky diode according to the preamble of claim 1.

BACKGROUND ART

Silicon carbide (SiC) represents a promising semiconductor material, which allows for higher power devices and higher frequency applications than known silicon devices. However, different manufacturing processes are needed for creating doped layer in silicon carbide substrates and for forming electrical contacts.

Prior art Junction Barrier Schottky (JBS) diodes comprise a cathode electrode, on which the following layers are arranged: an n doped cathode layer, a lower n-doped drift layer, a higher p+ doped anode layer. All doped layers are formed as doped silicon carbide layers. The anode layer is in contact to an anode electrode, which thus forms an ohmic contact to the anode layer. The anode electrode is formed as a continuous metal layer over the whole surface of the device. The drift layer extends to the surface of the silicon carbide. This layer has a Schottky contact to the anode electrode.

Thus, on the anode side of the device, a Schottky metal contact is deposited on top of the SiC drift layer associated to p+ implants for the anode layer, which are in close proximity to the Schottky junctions such that its depletion region under reverse bias creates a potential barrier to shield the Schottky junction from high electrical field, thus reducing leakage current.

Anode electrodes for prior art SiC Junction Barrier Schottky diodes are formed through the deposition of metal layer (typically Ti) on top of SiC n-type lightly doped drift layer and p+ implants. The metal layer is then annealed at maximum temperature below 700° C. in order to avoid degradation of the Schottky contacts or even ohmic contact formation in the Schottky regions, since ohmic contact formation occurs at more than 1000° C. in SiC.

However, such low temperature range is insufficient to form ohmic contact to the p+ anode layer even though it is highly doped.

Although the ohmic contact formation can be performed using extra deposition, annealing and lithography steps in order to first form the ohmic contact at high temperature followed by formation of the Schottky contact at low temperature, this would increase costs, and the conductive Schottky contact is inevitably compromised due to the lack of efficient selective cleaning of the areas dedicated as Schottky contact areas after the creation of the ohmic contacts, because such a cleaning, typically a wet cleaning also affects the ohmic contact.

In U.S. Pat. No. 8,450,196 B2 a manufacturing method id described, in which on a SiC substrate, a continuous metal layer is formed over the whole surface of the substrate (creating a Schottky contact). Afterwards, a mask having openings is applied, and the metal layer is irradiated through the mask. As a result, at such places, at which the mask has openings, a high temperature can be applied to the metal layer, which converts the Schottky contact to an ohmic contact so that Schottky and ohmic contacts alternate. However, this method leads to poor accuracy and resolution due to the diameter of the heat beam defining the minimum size of the ohmic contacts and due to heat spreading in the metal layer the heat distributes to the lateral sides of the beam so that the interface between the ohmic contact and the Schottky contact becomes fuzzy.

JP 2011 165 660 A describes a method for creating a Schottky barrier diode. On p anode regions, a 30 nm Titanium and 100 nm Nickel layer is deposited. Between the p anode regions, a thick metal layer made of Molybdenum is deposited, which also covers the Ti/Ni metal layers, thus forming a common planar surface on the anode side. Now, all metal layers are simultaneously treated at a high temperature. Due to the usage of different metals, an ohmic joining layer is formed from the Ti/Ni layer and a Schottky barrier layer is formed from the Molybdenum layer.

EP 1 885 000 A2 describes a JBS Schottky diode, which has p+ and p doped regions. Due to the different doping concentrations of the p doped regions, an ohmic contact is formed on the heavily doped p+ regions, whereas in between these regions Schottky contacts are formed on the lowly doped p regions.

DISCLOSURE OF INVENTION

It is an object of the invention to provide a method for manufacturing a wide bandgap, in particular a Silicon carbide, junction barrier Schottky diode in which better ohmic contacts and Schottky contacts are achievable.

This object is achieved by a manufacturing method according to claim 1.

The inventive method for manufacturing a wide bandgap, in particular a Silicon carbide, junction barrier Schottky diode having an anode side and a cathode side opposite to the anode side, wherein a cathode layer of a first conductivity type is arranged on the cathode side, at least one anode layer of a second conductivity type, which is different from the first conductivity type, is arranged on the anode side, a drift layer of the first conductivity type is arranged between the cathode layer and the at least one anode layer, which drift layer extends to the anode side, wherein the following manufacturing steps are performed:
  a) providing a wide bandgap, in particular a silicon carbide substrate, which forms the cathode layer in the finalized diode;
  b) creating the drift layer on a side of the cathode layer opposite to the cathode side;
  c) creating the at least one anode layer on the drift layer on the anode side;
  d) applying a first metal layer having a first thickness on the anode side on top of the drift layer for forming a Schottky contact, which first metal layer contacts the drift layer,
  e) creating a second metal layer having a second metal layer thickness on top of at least one anode layer, wherein after having created the first and the second metal layer, a metal layer on top of the at least one anode layer has a second thickness and a metal layer on top of the drift layer has a first thickness, wherein the second thickness is smaller than the first thickness,
  f) then performing a first heating step at a first temperature, by which due the second thickness being smaller than the first thickness an ohmic contact is formed at the interface between the second metal layer and such at least one anode layer, on which a second metal layer has been applied on, wherein performing the first heating step such that a temperature below the first metal layer is kept below a temperature for forming an ohmic contact.

By varying the thicknesses of the metal layer (first and second metal layer) on the substrate prior to performing the first heating step a thicker metal layer may be deposited in areas, which are dedicated as Schottky contact areas (on top of the drift layer) and a thinner metal layer may be deposited in areas, which are dedicated as ohmic contact areas (on top of the anode layer).

The heating conditions at the first heating step (duration of heating, primary penetration of the heating beam, low thickness of the second metal layer) are chosen such that at the interface between the second metal layer and the SiC material an ohmic contact is formed. Exemplarily, the first temperature in and below the second metal layer is at least 850° C. or at least 1000° C., a temperature high enough to form the ohmic contact at the second metal layer/SiC interface.

At the first metal layer, which is thicker than the second metal layer, the heat is partially reflected and/or absorbed in the thick metal layer, and even in consideration of the heat transfer in the first metal layer, the temperature below the first metal layer is kept to a temperature below the minimum temperature for forming an ohmic contact.

The inventive method enables the formation of a good ohmic and Schottky contact. The ohmic contact is formed without compromising the Schottky contact integrity or vice versa.

The inventive manufacturing method can also be applied such that heating steps are combined like the first and second heating step for the formation of the Schottky and ohmic contact or the first heating step and a heating step for annealing/diffusing the anode layer. As the anode layer is formed below the second metal layer, temperatures, exemplarily as high as 850° C. or higher are present at the implant areas for the anode layer, which temperature is sufficient for annealing the anode layer.

The manufacturing method is exemplarily applied in the active area of the inventive diode, but the inventive method may also be performed in the termination area, which laterally surrounds the active area depending of layers created in the termination region and electrical contacts, if such layers are contacted by an electrical contact.

Further preferred embodiments of the inventive subject matter are disclosed in the dependent claims.

BRIEF DESCRIPTION OF DRAWINGS

The subject matter of the invention will be explained in more detail in the following text with reference to the attached drawings, in which:

FIGS. 1 to 7 and 10 to 13, 15 and 17 show steps for an inventive methods for manufacturing a SiC JBS diode;

FIGS. 8 to 9, 14 and 16 show different SiC JBS diodes manufactured according to an inventive manufacturing method.

The reference symbols used in the figures and their meaning are summarized in the list of reference symbols. Generally, alike or alike-functioning parts are given the same reference symbols. The described embodiments are meant as examples and shall not confine the invention.

MODES FOR CARRYING OUT THE INVENTION

Figure 1:
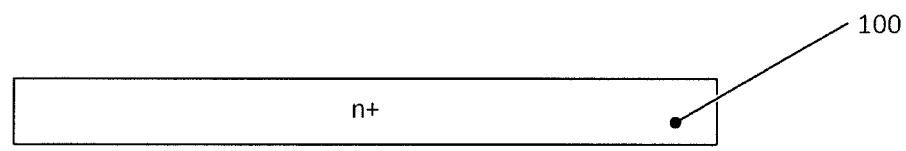
Figure 2:
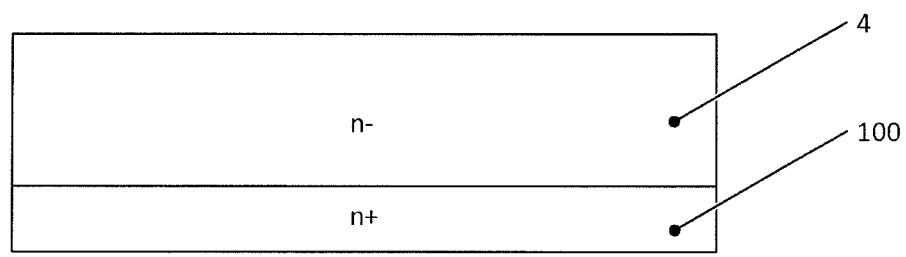

An inventive method is provided for manufacturing a wide bandgap, in particular a Silicon carbide, junction barrier Schottky diode 1 having an anode side 10 and a cathode side 15 opposite to the anode side 10. An (n+) highly doped cathode layer 2 is arranged on the cathode side 15. At least one p doped anode layer 3 is arranged on the anode side 10 and in-between these two layers an (n−) lowly doped drift layer 4 is arranged. On the anode side 10, the drift layer 4 extends to the anode side 10. The following manufacturing steps are performed:

a) providing a wide bandgap, in particular a silicon carbide substrate 100, which forms the cathode layer 2 in the finalized diode 1 (FIG. 1), b) creating the drift layer 4 on a side of the cathode layer 2 opposite to the cathode side 15 (FIG. 2), c) creating the at least one anode layer 3 on the drift layer 4 on a side opposite to the cathode side 15 (FIG. 3), d) applying a first metal layer 5 having a first thickness 52 on the anode side 10 on top of the drift layer 4 for forming a Schottky contact, which first metal layer 5 contacts the drift layer 4 (FIG. 4), e) creating a second metal layer 6 having a second metal layer thickness 62 on top of at least one anode layer 3, wherein after having created the first and the second metal layer 5, 6, and for the following heating step (f) a metal layer on top of the at least one anode layer 3 has a second thickness 64 and a metal layer on top of the drift layer 4 has a first thickness 54, wherein the second thickness 64 is smaller than the first thickness 54, f) then (i.e. after having performed step d) and e)) performing a first heating step 63 at a first temperature, by which due the second thickness 64 being smaller than the first thickness 54 an ohmic contact 65 is formed at the interface between the second metal layer 6 and such at least one anode layer 3, on which a second metal layer 6 has been applied on, wherein performing the first heating step 63 such that a temperature below the first metal layer 5 is kept below a temperature for forming an ohmic contact.

The wide bandgap substrate may be made of any wide bandgap material like silicon carbide, Gallium nitride or Gallium arsenide, but any other wide bandgap material is also possible.

The first heating step 63 is performed such that the temperature at the interface of the second metal layer and the at least one anode layer 3 (i.e. first temperature) is high enough to form an ohmic contact, whereas due to the higher thickness of the metal layer above the drift layer (first thickness) the temperature at the interface of the first metal layer and the drift layer is below such temperature to form an ohmic contact, i.e. a Schottky contact is formed.

For a silicon carbide substrate 100, the substrate 100 may consist of any kind of the silicon carbide, exemplarily of 3C-Silicon carbide or 4H-silicon carbide or 6H-silicon carbide. Exemplarily, the doping concentration of the Silicon carbide substrate 100 and thus, also of the cathode layer 2 may be between $1*10^{18}$ and $1*10^{19}$ cm$^{-3}$. The thickness of the silicon carbide substrate 100 is of such thickness, that the electrical properties desired in the finalized diode 1 are achieved and that the substrate 100 is robust during the handling during the manufacturing steps. The substrate 100 may be provided in a thickness, which is later in the manufacturing method reduced, so that the substrate 100 is more robust during handling, but later optimized for the electrical properties in the device. Such thinning, exemplarily made by a mechanical and/or chemical removing step like grinding, polishing and/or etching may be performed at any desired manufacturing step.

In step a) the substrate 100 may be a wafer, on which a plurality of diodes are created simultaneously. Alternatively, in step a) the substrate may be a chip, on which a single diode is created.

After step a) and before step b) on the silicon carbide substrate 100, an n doped buffer layer 8 having a lower doping concentration than the substrate 100 and a higher doping concentration than the drift layer 4 may be created on the side of the substrate 100 opposite to the cathode side 15 (see FIG. 9, in which the finalized diode 1 is shown having the n doped buffer layer 8 arranged between the cathode layer 2 and the drift layer 4). The doping concentration of the buffer layer 8 is exemplarily between $1*10^{17}$ and $5*10^{18}$ cm$^{-3}$; and the thickness may be between 0.5 and 2 μm.

Exemplarily the doping concentration of the drift layer 4 may be between $1*10^{14}$ and $1*10^{18}$ cm$^{-3}$. The thickness of the drift layer 4, i.e. the extension of the layer in a direction perpendicular to the cathode side 15, may exemplarily be between 3 and 150 μm. The drift layer 4 and the buffer layer 8, if such a layer is present in the diode 1 manufactured according to the inventive method, may be created by epitaxial growth. By such an epitaxial growth, exemplarily a layer of constant doping concentration is created, but of course also a variation of doping concentration is possible, e.g. a decreasing doping concentration in direction from the cathode to the anode side. The values for the doping concentration given above shall be understood as the mean doping concentration is case of constant doping concentration (not excluding variation of doping concentration due to imperfection of the manufacturing method) or as a maximum doping concentration in case of varying doping concentration.

In step c) at least one anode layer 3 is created having a maximum doping concentration between $1*10^{16}$ and $1*10^{21}$ cm$^{-3}$ or between $1*10^{17}$ and $1*10^{20}$ cm$^{-3}$ or between $1*10^{17}$ and $1*10^{18}$ cm$^{-3}$. The at least one anode layer 3 may be created by epitaxial growing a p doped layer or by applying a dopant, e.g. by implantation, followed by thermal annealing, exemplarily both methods after having created a recess, e.g. by etching, in which a p dopant is filled. The at least one anode layer 3 is laterally (in a plane parallel to the anode side 10) limited so that adjacent to the at least one anode layer 3 the drift layer 4 extends to the anode side 10, i.e. to the surface of the SiC material.

The at least one anode layer 3 may also be created after step d) and before step e) by using the first metal layer 5, which has openings at such areas, in which in step e) a second metal layer will be created and in which in step f) an ohmic contact shall be created, as a mask. As the first metal layer partially covers the drift layer, in such areas no anode layer 3 is created, whereas in such areas having an opening, the p dopant may be applied.

At the heating step f), i.e. at the step, in which the ohmic contact is formed, the thickness of all metal layers on top of the drift layer (i.e. first thickness 54) is of such high thickness that below the metal layer, a Schottky contact is established. The thickness of all metal layers on top of the anode layer (i.e. second thickness 64) is of such low thickness that below the metal layer, an ohmic contact is established.

Figure 3:
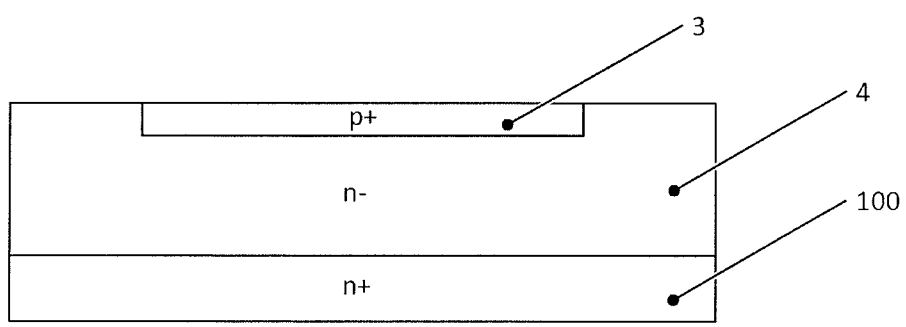
Figure 4:
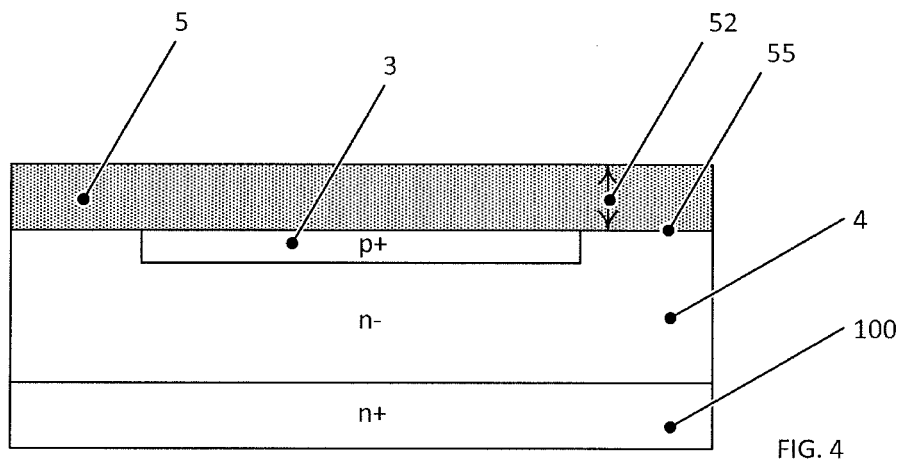
Figure 12:
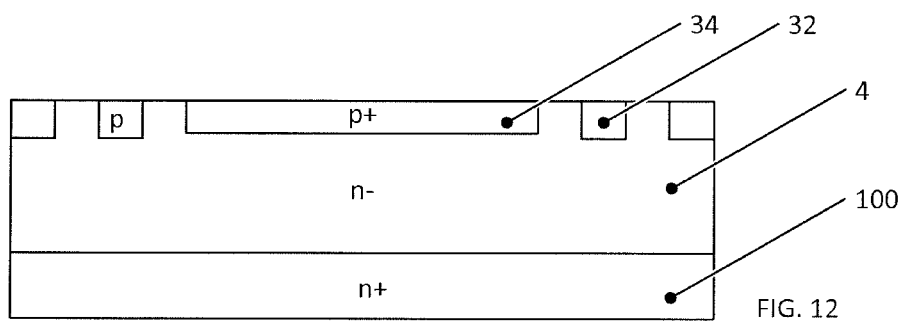
Figure 13:
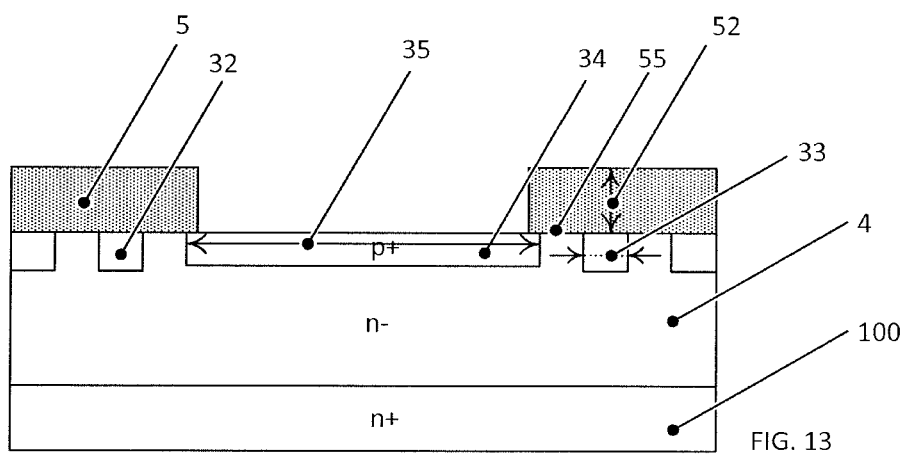

The at least one anode layer 3 may be a single anode layer (e.g. as shown in FIG. 3) or it may comprise a plurality of p doped regions 32, 34 (as exemplarily shown in FIG. 12). Such p doped region may all have the same size or the anode layer 3 may comprise at least one p doped well region 32 having a first width 33 and at least one p doped surge region 34 having a second width 35, which is larger than the first width 33 (FIG. 13). The maximum doping concentration of the well and surge regions 32, 34 may be the same, but it is also possible that the regions 32, 34 have different maximum doping concentrations.

The anode layers 3 are p doped layers in the active cell area of the device. The active cell area extends from the anode to the cathode side 10, 15 and comprises areas, which are actively electrically controllable. The device comprises an active cell area, which is surrounded by a termination area. In the active cell area one or a plurality of cells are arranged, which comprise the cathode layer 2, (if present the buffer layer 8) drift layer 4, and the anode layer 3, wherein as cathode or anode layer 2, 3 such part of n or p doped regions shall be understood, which are connected to a cathode 25 or anode electrode (ohmic contact 65) or are in projection to such a connection and the areas in between (exemplarily the areas, in which a Schottky contact 55 is present between a metal layer and the drift layer 4). All ohmic contacts 65, which are connected to the anode layer 3, form the anode electrode. In case of the anode and cathode electrode 65, 25 having a different form, the active cell area in-between forms a frustum or a prismatoid, having the anode and cathode electrode 65, 25 as base areas and the doped SiC layers in-between as lateral faces (exemplarily the lateral faces have the form of triangles or trapezia). In case of the anode electrode comprising a plurality of ohmic contacts 65, the enveloping area shall be regarded as the anode electrode only in the sense for assessing the active cell area.

The width of regions shall be understood as a shorter extension of the region compared to an extension of the region perpendicular to the shorter extension or in the case of having the same extension in both directions as one of these extensions (i.e. in the case of a circle the width shall be regarded as the diameter of the circle or in the case of a square as the edge length of the square), all measured in a direction parallel to the anode side. Exemplary designs of the well regions 32 are stripes, squares (in which the width and the length are the same) or circles, in which the width is the diameter, or a hexagonal design, also called "honeycomb" design, which have exemplarily a width of 1 to 10 μm. Thus, the width shall be the maximum diameter of a circle that can be completely laid into the region in a plane parallel to the cathode side.

The second width 35 (of the surge region(s) 34) may be larger than the first width 33 (of the well region(s) 32). Exemplarily, the second width 35 is at least 10 times larger than the first width 33. In an exemplary embodiment, the well region(s) 32 is/are created with a first width 33 being between 1 to 5 μm and/or the surge region(s) 34 is/are created with a second width 35 being between 50 to 300 μm. The surge region(s) can have any shape and also the ones mentioned above for the well regions as stripes, square, circles or hexagonal design.

An ohmic contact 65 is an electrical junction between two conductors (i.e. for a semiconductor between a metal layer and a semiconductor layer, i.e. a doped Silicon-carbide layer) that has a linear current—voltage behavior. An ohmic contact has low resistance. The ohmic contacts 65 on the anode side 10 form the anode electrode for the inventive SiC diode. By contrast, the Schottky contact 55 is a junction or contact that does not demonstrate a linear I-V curve (so that it is a non-ohmic contact). The Schottky barrier of a Schottky contact between a metal and a semiconductor band defines the device opening voltage in forward bias, i.e., carrier flows when the barrier is overcome.

Figure 14:
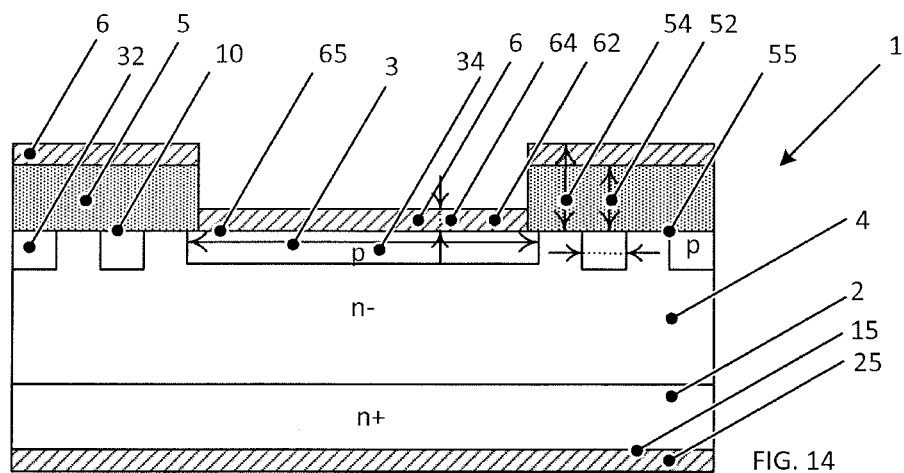

In an exemplary embodiment, for an anode layer 3 comprising well region(s) 32 and surge region(s) 34, it is possible to have ohmic contacts 65 exclusively at the interface of surge region 34 and second metal layer 6 (exemplarily shown in FIG. 13, in which the well regions 32 are covered by the first metal layer 5, so that an ohmic contact 65 is only formable at the surge region 34 (FIG. 14). That means that the thin second metal layer 6 is created exclusively above the surge regions 34, whereas all well regions 32 are covered by the thicker first metal layer 5.

Figure 15:
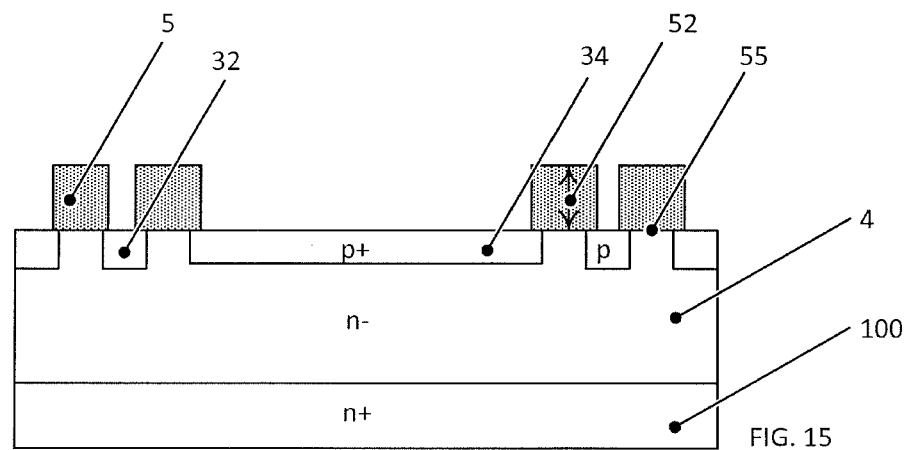
Figure 16:
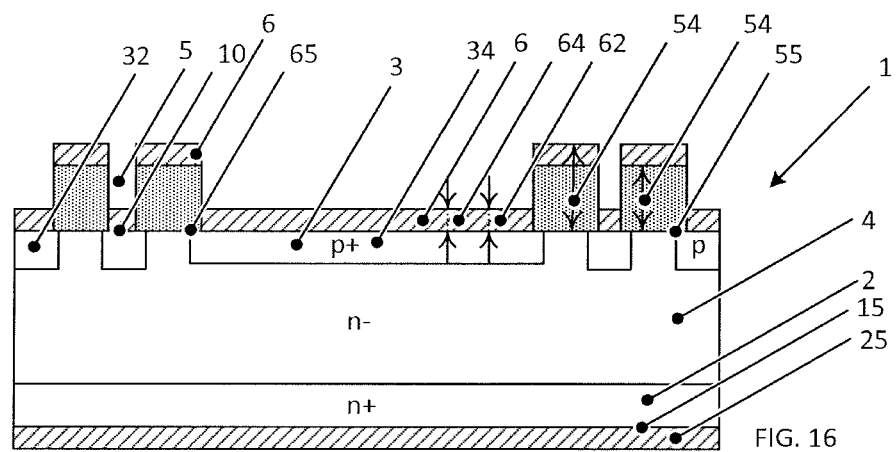

Alternatively, the ohmic contacts 65 may be created at the surge region(s) 34 as well as on the well region(s) 32 (FIG. 16). For such a device, the first metal layer 5 is arranged above all areas, in which the drift layer 4 extends to the anode side 10, i.e. the surface of the SIC carbide material on the anode side 10, at least in the active cell area or also in the termination area. The second metal layer 6 is arranged on top of all anode layers 3, i.e. if present on top of the surge and well regions 34, 32 (FIG. 15).

In another exemplary embodiment, in step d) the first metal layer 5 is applied with a first metal layer thickness 52 between 200 nm to 5 µm. In step e) the second metal layer 6 may be applied with a second metal layer thickness 62 between 1 to 200 nm. Thus, the first thickness 54 may be between 200 nm to 5.2 µm (which depending on the manufacturing method corresponds to the first metal layer thickness 52 or the first plus second metal layer thickness 52, 62) and the second thickness 64 may be between 1 to 200 nm (which corresponds to the second metal layer thickness 62). The metal for the second thickness 64 is either created by applying a second metal layer 6 on the drift layer 4 or by removing material from the first metal layer 5, which reduced thickness corresponds to the second metal layer thickness 62, which is also the second thickness 64.

Exemplarily, the material used for the creation of the first and/or second metal layer 5, 6 is a noble metal, i.e. a metal that is resistant to corrosion and oxidation in moist air. Noble metals are exemplarily Palladium, Platinum, Aluminium, or a compound comprising Titanium and at least one of Palladium, Platinum or Aluminium. In another exemplary embodiment, the material used for the creation of the first and/or second metal layer 5, 6 is a refractory metal, i.e. a metal that is extraordinarily resistant to heat and wear. Refractory metals are exemplarily Nickel, Titanium, Tantalum, Tungsten or Cobalt. The material used for the first and/or second metal layers 5, 6 may also be a compound of any of the before mentioned metals. The same metal or metal compound may be used for both first and second metal layers 5, 6, but it is also possible to use different metals or metal compounds.

It is also possible to apply any of the first and/or second metal layer 5, 6 as a stack of layers of at least two of the before mentioned metals. An additional Aluminium layer may be applied on top of the first metal layer 5. This Al layer thus is part of the first metal layer 5, thus contributes to the first thickness 54, but also acts as a blocking layer for the heat beam. Furthermore, the Aluminium enables a good bonding metal contact for the Schottky contacts. Exemplarily, the aluminium layer has a thickness of 3 to 5 µm.

In step f), a first temperature (measured at the interface of the second metal layer 6 and at least one anode layer 3) is applied. Exemplarily, the first temperature is at least 850° C. or at least 1000° C. As the second metal layer 6 (which is arranged above the anode layer 3, and having the second thickness 64) is thinner than the first metal layer 5 (which is arranged above the drift layer 4 and which comprises the first and second metal layer 5, 6, together having the first thickness 54), the temperature below the first metal layer 5 is lower than below the second metal layer 6. The heating conditions for the first heating step 63, exemplarily the heating duration or heating pulses and penetration depth of the a heating beam produced by a heating source (e.g. the wavelength of the heating beam) and the first thickness 52 and the material of the first metal layer 5 are chosen such that the temperature below the first metal layer 5, i.e. at the interface to the drift layer 4 stays below a temperature for forming an ohmic contact, i.e. exemplarily the temperature is kept below 800° C., below 700° C. or below 650° C.

Different heating sources may be used for applying the first temperature. Exemplarily, a laser beam is applied for performing the first heating step 63. Such a laser beam may also be applied through a mask or by scanning the areas, at which the heat shall be applied (i.e. at the areas at which the first metal layer is present). Any other method to focus the laser beam to the areas of the first metal layer may be also used like applying reflector layers. The layer beam may be applied as a pulsed layer, by which heat transfer to the interface between first metal layer and anode layer can be at least reduced. Other heating sources, exemplarily of heating sources creating a local heat beam above the second metal layer and avoided thermal damage to the adjacent areas), may also be used like an electron or ion beam.

After having applied the first metal layer 5 (i.e. after step d)), a second heating step 53 may be performed (FIG. 10) at a second temperature, by which the Schottky contact 55 is improved at the interface between the first metal layer 5 and the drift layer 4. The second temperature (measured at the interface of the first metal layer 5 and the drift layer 4) is lower than a temperature for forming an ohmic contact, but it is so high that the Schottky contact is improved. Exemplarily, the second temperature is below 800° C. or below 650° C. The second temperature is exemplarily higher than 400° C.

It is also possible to create a first and second metal layer 5, 6 and to apply in step f) a first temperature such that below the first metal layer 5 the temperature is below 800° C., below 700° C. or below 650° C., i.e. the before mentioned second heating step 63 is performed simultaneously with the first heating step 53.

Figure 17:
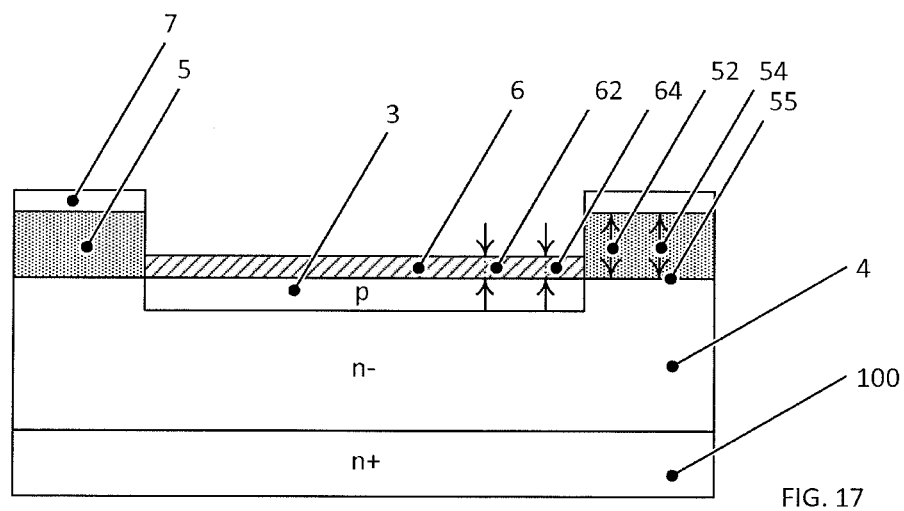

In another exemplary embodiment, after step d) a blocking layer 7 may be applied on top of the first metal layer 5, which blocking layer 7 has openings at the second metal layer 6 (FIG. 17). In the blocking layer 7 heat is at least one of reflected or absorbed, so that in step f) the temperature below the first metal layer 5 is further reduced. The blocking layer 7 may be made of silicon or an oxide or silicon dioxide or a photoresist layer. Due to the thickness differences between the first and second metal layer 5, 6, the temperature below the first metal layer 5 is already much lower than below the second metal layer 6. The blocking layer 7 further enhances this effect, i.e. heat is effectively hindered or reduced from reaching the interface between the first metal layer 5 and the drift layer 4, so that the Schottky contact 55 is maintained in step f), whereas due to the lower thickness of the second metal layer 6, in step f) an ohmic contact 65 is created.

On the cathode side 15, a cathode electrode 25 is formed at any appropriate manufacturing step. The cathode electrode 25 is exemplarily an ohmic contact and may also be formed by applying a metal layer (like those mentioned for the creation of the ohmic contact on the anode side), which is heated to a temperature high enough for establishing an ohmic contact, exemplarily to a temperature above 850° C. or above 1000° C. The cathode electrode 25 contacts the cathode layer 2.

Figure 5:
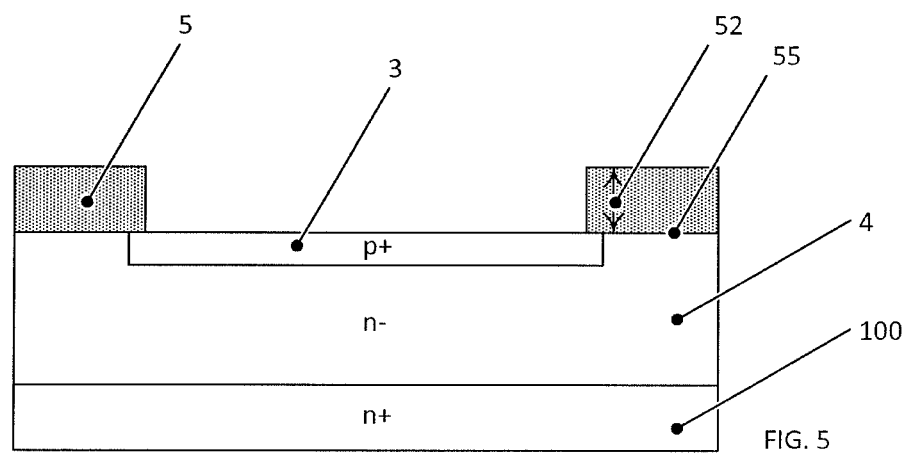
Figure 6:
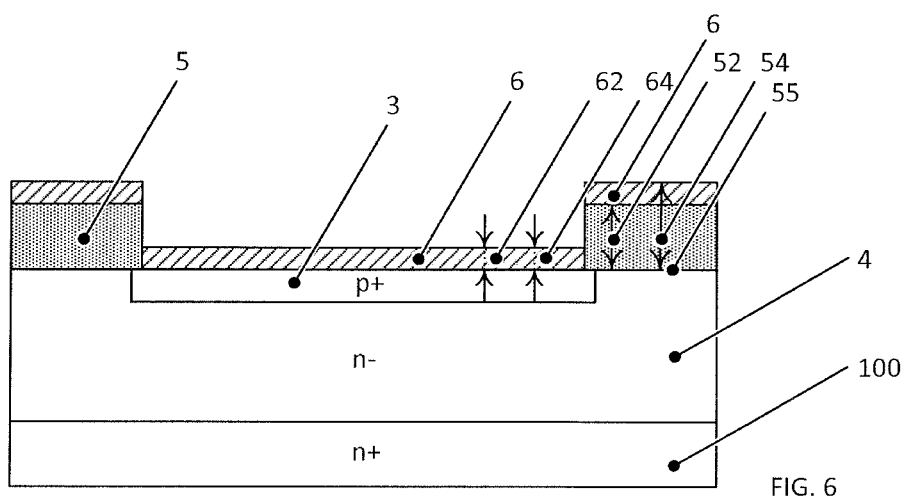
Figure 7:
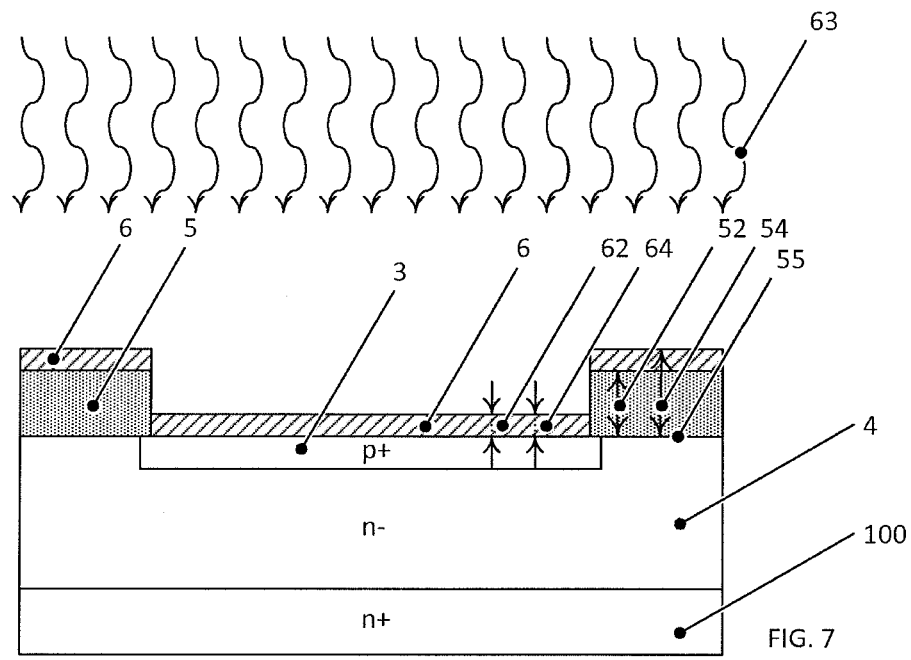
Figure 8:
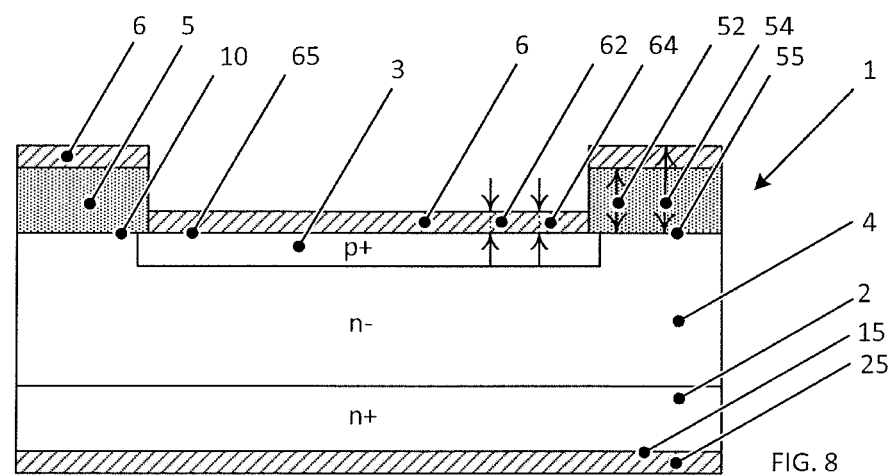
Figure 11:
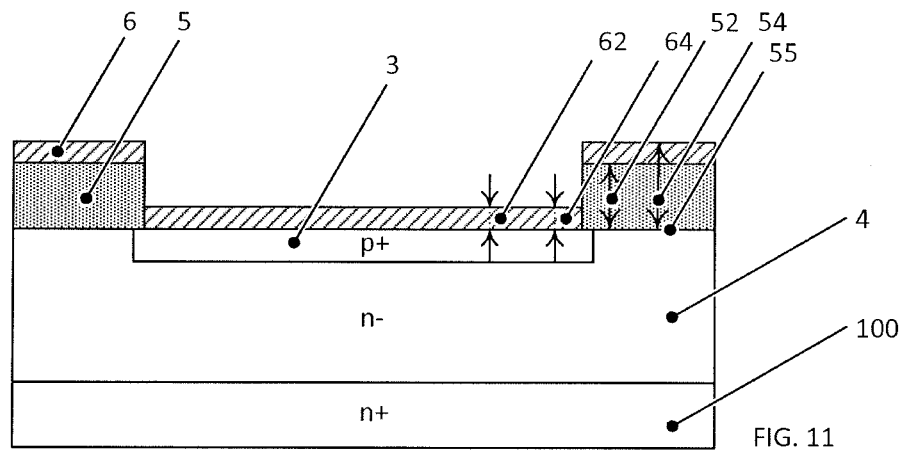

Exemplarily, in step d) a continuous first metal layer 5 may be applied (FIG. 4), covering the whole SiC surface on the anode side 10 or at least the active cell area. In step e) the second metal layer 6 may be created by partially removing the first metal layer 5 above such at least one anode layer 3, at which an ohmic contact 65 is formed in step f), so that above those regions at which in step f) an ohmic contact 65 shall be established, the thickness of the second metal layer 6 is reduced to the second thickness 64, keeping the first thickness 54 above such areas, at which a Schottky contact 55 shall be maintained (FIG. 6). Reducing the thickness to the second thickness 64 can mean that the thickness is reduced in one step (FIG. 6) or that the first metal layer 5 is completely removed above such at least one anode layer 3, at which an ohmic contact 65 shall be formed (FIG. 5). Afterwards the second metal layer 6 may be applied, either through a mask conclusively above the at least one anode layer 3, at which an ohmic contact 65 shall be formed, or as a continuous layer, which also covers the first metal layer 5 and thereby becomes part of the metal layer on top of the drift layer 4, i.e. the metal layer on top of the drift layer 4 then comprises the first metal layer 5 applied in step d) and the second metal layer 6 applied in step e) (FIG. 11) resulting in a first thickness 54 comprising the first metal layer thickness 52 and the second metal layer thickness 62. The second thickness 64 is the thickness of all metal layers above the p anode layer 3, which in this case is the thickness of the second metal layer 62.

In another embodiment, the conductivity types of the layers are switched, i.e. all layers of the first conductivity type are p type (e.g. the cathode layer 2 or drift layer 4) and all layers of the second conductivity type are n type (e.g. the anode layer 3).

REFERENCE LIST

1 Junction barrier Schottky diode
10 anode side
15 cathode side
100 wide bandgap substrate
2 cathode layer
25 cathode electrode
3 anode layer
32 well region
33 first width
34 surge region
35 second width
4 drift layer
5 first metal layer
52 first thickness
53 second heating step
54 first thickness
55 Schottky contact
6 second metal layer
62 second thickness
63 first heating step
64 second thickness
65 ohmic contact
7 blocking layer
8 buffer layer

The invention claimed is:

1. A method for manufacturing a wide bandgap junction barrier Schottky diode having an anode side and a cathode side opposite to the anode side, wherein a cathode layer of a first conductivity type is arranged on the cathode side, at least one anode layer of a second conductivity type, which is different from the first conductivity type, is arranged on the anode side, a drift layer of the first conductivity type is arranged between the cathode layer and the at least one anode layer, which drift layer extends to the anode side, wherein the method comprises:

a) providing a wide bandgap substrate, which forms the cathode layer in the finalized diode, b) creating the drift layer on a side of the cathode layer opposite to the cathode side, c) creating the at least one anode layer on the drift layer on the anode side, d) applying a first metal layer having a first metal layer thickness on the anode side on top of the drift layer for forming a Schottky contact, which first metal layer contacts the drift layer e) creating a second metal layer having a second metal layer thickness on top of at least one anode layer, which second metal layer contacts the at least one anode layer, wherein after having created the first and the second metal layer, a total thickness of all metal layers on top of the at least one anode layer is a second thickness and a total thickness of all metal layers on top of the drift layer is a first thickness, wherein the second thickness is smaller than the first thickness, f) then performing at first heating step at a first temperature at an interface of the second metal layer and the at least one anode layer, by which due the second thickness being smaller than the first thickness an ohmic contact is formed at the interface between the second metal layer and such at least one anode layer, on which a second metal layer has been applied on, wherein performing the first heating step such that a temperature below the first metal layer is kept below a temperature for forming an ohmic contact so that a Schottky contact is formed.

2. The method according to claim 1, wherein in step e) applying the second metal layer as a continuous layer, which covers the first metal layer, wherein the first thickness comprises the first metal layer thickness and the second metal layer thickness.

3. The method according to claim 1, wherein after step d) performing a second heating step at a second temperature at an interface of the first metal layer and the drift layer below 800° C. and above 400° C., by which the Schottky contact is improved at the interface between the first metal layer and the drift layer.

4. The method according to claim 1, wherein in step f) the temperature below the first metal layer is kept below 800° C.

5. The method according to claim 1, wherein the wide bandgap substrate is a Silicon Carbide substrate.

6. The method according to claim 1, wherein in step c) creating at least one well region of the second conductivity type having a first width and at least one surge region of the second conductivity type having a second width, which is larger than the first width, wherein the at least one well region and the at least one surge region form the at least one anode layer.

7. The method according to claim 6, wherein at least one of the first width is between 1 to 5 μm or
    the second width is between 50 to 200 μm or
    the second width is at least 10 times larger than the first width.

8. The method according to claim 1, wherein in step d) applying the first metal layer with a first metal layer thickness between 200 nm to 5 μm.

9. The method according to claim 1, wherein in step f) applying the second metal layer with a second metal layer thickness between 1 to 200 nm.

10. The method according to claim 1, wherein in step f) the first temperature at the interface between the second metal layer is at least 850° C.

11. The method according to claim 1, wherein
in step d) applying a continuous first metal layer and
in step e) creating the second metal layer by partially removing the first metal layer above such at least one anode layer, at which an ohmic contact is formed in step f), to the second thickness.

12. The method according to claim 1, wherein
in step d) applying a continuous first metal layer and
in step f) creating the second metal layer by completely removing the first metal layer above such at least one anode layer, at which an ohmic contact is formed in step f), and afterwards applying a second metal layer.

13. The method according to claim 1, wherein after step d) applying a blocking layer on top of the first metal layer, which has openings at the second metal layer, in which heat is at least one of reflected or absorbed, thereby in step f) further reducing the temperature below the first metal layer.

14. The method according to claim 13, wherein using silicon or an oxide or silicon dioxide or a photoresist layer or an Aluminium layer as the blocking layer.

15. The method according to claim 1, wherein in step f) applying a laser beam for performing the first heating step.

16. The method according to claim 2, wherein after step d) performing a second heating step at a second temperature at an interface of the first metal layer and the drift layer below 800° C. and above 400° C., by which the Schottky contact is improved at the interface between the first metal layer and the drift layer.

17. The method according to claim 1, wherein after step d) performing a second heating step at a second temperature at an interface of the first metal layer and the drift layer below 650° C. and above 400° C., by which the Schottky contact is improved at the interface between the first metal layer and the drift layer.

18. The method according to claim 2, wherein in step f) the temperature below the first metal layer is kept below 800° C.

19. The method according to claim 1, wherein in step f) the temperature below the first metal layer is kept below 700° C.

20. The method according to claim 2, wherein in step f) applying a laser beam for performing the first heating step.

* * * * *